United States Patent [19]

Clarke et al.

[11] Patent Number: 5,139,850

[45] Date of Patent: Aug. 18, 1992

[54] ELECTROMAGNETIC SHIELDING PANEL

[75] Inventors: Leslie T. Clarke, Wirral; Mervyn J. Davies, Southport, both of England

[73] Assignee: Pilkington plc, Merseyside, England

[21] Appl. No.: 453,160

[22] Filed: Dec. 19, 1989

Related U.S. Application Data

[63] Continuation of Ser. No. 151,988, Feb. 3, 1988, abandoned.

[30] Foreign Application Priority Data

Feb. 3, 1987 [GB] United Kingdom ............... 8702357

[51] Int. Cl.⁵ .......................... E06Q 3/24; H05K 9/00
[52] U.S. Cl. ........................................ 428/192; 428/34;
428/334; 428/414; 428/415; 428/416;
428/425.8; 428/432; 428/434; 428/457;
428/458; 428/469; 428/472; 428/699; 428/701;
428/702; 174/35 MS; 52/788; 52/790; 358/242;
358/255
[58] Field of Search ................ 428/334, 344, 34, 458,
428/432, 433, 908.8, 192; 174/35 MS; 52/171,
789, 790, 788; 358/245, 252, 255, 253;
267/10.55; 428/412, 414, 415, 416, 425.8, 432,
434, 457, 458, 469, 472, 699, 701, 702

[56] References Cited

U.S. PATENT DOCUMENTS

| | | | |
|---|---|---|---|
| 4,017,661 | 4/1977 | Gillery | 428/432 |
| 4,412,255 | 10/1983 | Kuhlman et al. | 174/35 MS |
| 4,450,201 | 5/1984 | Brill et al. | 428/432 |
| 4,459,470 | 7/1984 | Slichta et al. | 428/432 |
| 4,497,700 | 2/1985 | Groth et al. | 428/432 |
| 4,590,118 | 5/1986 | Yatabe et al. | 428/215 |
| 4,613,530 | 9/1986 | Hood et al. | 174/35 MS |
| 4,670,347 | 6/1987 | Lasik et al. | 174/35 MS |
| 4,710,426 | 12/1987 | Stephens | 428/421 |

FOREIGN PATENT DOCUMENTS

| | | |
|---|---|---|
| 0024900 | 3/1981 | European Pat. Off. . |
| 0035906 | 9/1983 | European Pat. Off. . |
| 769697 | 3/1957 | United Kingdom . |
| 1307642 | 2/1973 | United Kingdom . |
| 1336825 | 11/1973 | United Kingdom . |
| 1391726 | 4/1975 | United Kingdom . |
| 1413717 | 11/1975 | United Kingdom . |
| 2064629 | 6/1981 | United Kingdom . |
| 2129831 | 5/1984 | United Kingdom . |

Primary Examiner—Ellis P. Robinson
Assistant Examiner—Donald J. Loney
Attorney, Agent, or Firm—Burns, Doane, Swecker & Mathis

[57] ABSTRACT

The invention concerns an electromagnetic shielding panel for attenuating electromagnetic radiation typically in the frequency range 20 MHz to 10,000 MHz. In one embodiment of the invention, the panel comprises a laminate of two panes of glass one of which includes an electroconductive coating sandwiched between the two sheets of glass is a plastics interlayer (i) into which is embedded four strips of fine electroconductive mesh which lie along the edge of the laminate and which are in electrical contact with the coating. In another embodiment of the invention, the coated glass includes peripheral bus bars which are in electrical contact with the coating. The mesh and bus bars are arranged to make electrical contact with a metal frame which may be earthed. Alternatively, no direct mechanical contact is made between the frame and the coating and a capacitive coupling (cc) suffices.

16 Claims, 2 Drawing Sheets

ELECTROMAGNETIC SHIELDING PANEL

This application is a continuation of application Ser. No. 07/151,988, filed Feb. 3, 1988, now abandoned.

BACKGROUND OF THE INVENTION

The invention relates to electromagnetic shielding panels and, in particular, to translucent electromagnetic shielding panels comprising a pane of coated glass or plastics.

Glass and transparent plastics are translucent to short wave electromagnetic radiation, i.e. radiation having a frequency in the range 20 to 10000 MHz, so that stray emissions from electronic data processing equipment can escape through windows and be detected outside. Such escape prejudices the security of the information being processed. Moreover, entry of extraneous electromagnetic signals, such as radar signals, through the windows of rooms housing electronic data processing equipment can effect the proper operation of the equipment.

It is known that the transmission of short wave electromagnetic radiation through windows can be prevented or at least reduced by providing the window with a continuous electroconductive layer and earthing the layer all around the periphery of the window to provide an electromagnetic shielding window.

A number of glass products incorporating electroconductive layers have been offered for use in electromagnetic shielding windows. One such product is glass carrying an indium tin oxide coating having a sheet resistance in the range 4 to 6 ohms per square. Such coatings may be deposited by reactive sputtering but, in order to obtain the high conductivity (low resistance) required, it is necessary to heat the glass substrate. Suitable apparatus for coating large areas of glass is expensive; the coatings are therefore generally deposited in relatively small areas and are expensive to apply.

Another known product is laminated glass incorporating a layer of fine metal mesh in a plastics interlayer between two panes of glass. Unfortunately, the mesh not only reduces the light transmission through the laminate but also obscures the view. Moreover, because the final metal mesh is expensive, laminates incorporating the mesh are expensive to produce.

It has also been proposed to apply a polyester film carrying a sputtered coating of a metal or metal alloy such as titanium, stainless steel, bronze, sterling silver or 24 carat gold to glass with the coated face of the film towards the glass to provide an electromagnetic shield. Unfortunately, it is difficult to make electrical contact with the coating on the film without damaging the film, so that there are problems in earthing the coating.

There is a need for a high performance translucent electromagnetic shielding panel which can be produced economically with good optical properties.

SUMMARY OF THE INVENTION

According to the present invention there is provided a translucent electromagnetic shielding panel comprising a pane of glass carrying a coating comprising a silver layer having a thickness in the range 15 nm to 50 nm and a protective layer over the silver, with electrical connection means in electrical contact with the silver layer all around the periphery of the coating.

The use of the silver coated glass referred to herein as a light translucent shield against electromagnetic radiation having a frequency in the range 20 to 10000 MHz is novel and forms part of the present invention.

The use of a silver layer having a thickness of at least 15 nm enables a coating with a sheet resistance of less than 5 ohms per square to be achieved. Preferred coatings have a silver layer at least 22.5 nm thick to provide even lower sheet resistance. Unfortunately, the thicker the silver layer, the greater the coast of the coating and the lower the light transmission of the coated glass. Thus the silver layer preferably has a thickness of less than 40 nm. Especially preferred coatings have a silver layer having a thickness in the range of 22.5 nm to 30 nm.

To enhance the light transmission of the coated glass, the silver layer may be sandwiched between anti-reflection layers of metal oxide, the outer layer also serving to protect the silver. Examples of metal oxide which may be used include titanium oxide, tin oxide, indium tin oxide, zinc oxide and bismuth oxide. The anti-reflection layers will generally each have a thickness in the range 20 nm to 60 nm. It is preferred to use tin oxide for the anti-reflection layers, and, for optimum light transmission, the tin oxide layers will each have a thickness in the range 30 nm to 50 nm depending on the thickness of the silver layer.

The silver coatings referred to above can be deposited by magnetically enhanced sputtering as described in UK patent GB 2 129 831B.

The silver coatings are not very durable and are preferably protected by incorporating the coated pane in a laminate, or alternatively, a multiple glazing unit, with the coating facing inwards.

It will usually be necessary for the electrical connection means to be a mechanical coupling in order to achieve the required electrical connection with the coating. To achieve superior reductions in electromagnetic radiation, through the electromagnetic shielding panel, a direct mechanical coupling is generally necessary between an electroconductive surround means in the form of a metal frame supporting the glass and the coating. The electrical connection means in this case may take the form of a fine mesh or bus bar. However, in some cases electrical connection means in the form of a capacitive coupling between the coating and the metal frame (preferably overlapping the coating) around the periphery of the coated glass may provide sufficient electrical coupling, and a direct mechanical coupling using either the mesh or bus bar technique will be unnecessary. The metal frame may, if required, be electrically coupled to earth.

In the circumstances when a capacitive coupling is employed, the attenuation offered by the panel to electromagnetic radiation may vary considerably in dependence upon the thickness of the glass employed, the type of metal frame supporting the glass (i.e. the degree of overlap with the coating), and the frequency range of electromagnetic radiation concerned.

As a general guide, however, it is possible to obtain substantial attenuation of electromagnetic radiation with capacitive coupling in the range from 200 MHz upwards to 10,000 MHz averaging between 20 to 25 dB. These attenuation figures progressively reduce at frequencies below 200 MHz.

When electrical connection means in mechanical contact with the coating is used to provide the required electrical contact with the coating at least partly around the periphery of the coating, the electrical connection means may be, for example, in the form of bus bars; the bus bars may be printed onto the coated glass using a UV-curable electroconductive epoxy ink and the ink cured by exposure to ultra-violet light. The bus bars may extend around the edges of the glass pane to its opposite face. The high contact resistance between the bus bars and the silver layer of the coating (resulting from the presence of the protective layer over the silver) may be reduced by applying a high voltage between the coating and the bus bars (as described, for example, in U.S. Pat. No. 4,459,470). In another form of the invention, the coated glass is laminated with its coated face inwards to protect the coating, and a border of fine electroconductive mesh, for example fine wire mesh, is sandwiched between a plastics interlayer and the coating in electrical contact with the silver layer around the whole periphery of the coating.

The invention is illustrated by not limited by the following description of the production of a translucent electromagnetic shielding panel in accordance with the invention.

A sheet of 3 mm clear float glass was coated by a magnetically enhanced sputtering process as described in UK patent GB 2,129,831B.

The glass pane was washed and dried and loaded into an Airco ILS 1600 D.C. planar magnetron sputtering apparatus. Tin oxide ($SnO_2$) was reactively sputtered on to the glass from a tin cathode in the presence of an oxygen atmosphere at $5 \times 10^{-3}$ torr to give a tin oxide layer approximately 35 nm thick. A layer of silver approximately 25 nm thick was then sputtered onto the tin oxide from a silver cathode in the presence of an argon atmosphere at $4 \times 10^{-3}$ torr, and alumunium in an amount equivalent to a layer approximately 2 nm thick was sputtered over the silver from an alumunium cathode in the presence of an argon atmosphere at $4 \times 10^{-3}$ torr. Finally, a layer of tin oxide approximately 38 nm thick was reactively sputtered over the aluminium from a tin cathode in the presence of an oxygen atmosphere at $5 \times 10^{-3}$ torr.

The coating produced was analysed by Auger electron spectroscopy, as described in UK patent GB 2 129 831B, and the thickness of the various layers estimated from the resultant spectrum as follows:

| Lower tin oxide layer | 35 nm | |
|---|---|---|
| Silver layer | 25 nm | |
| Aluminium oxide layer | 7 nm | (equivalent to a layer of aluminium 2 to 3 nm thick) |
| Outer tin oxide layer | 34 nm | |

The sheet resistance of the coating was measured by the 4 point probe method, and the optical properties of the coated glass were measured using light from a CIE Illuminant C Source on the side of the glass remote from the coating:

| Light transmission | 52% |
|---|---|
| Light reflection | 33% |
| Direct solar heat transmission | 29% |
| Solar heat reflection | 49% |
| Solar heat absorption | 22% |
| Total solar heat transmission | 33% |
| Emissivity of coating | 0.015 |
| Sheet resistance | 2.5-3.0 ohms per square |

A pane 1500 mm×450 mm was cut from the coated sheet and laminated to a 3 mm pane of clear float glass with an interlayer of polyvinylbutyral. Strips of fine electroconductive wire mesh were incorporated in the laminate in electrical contact with the coating along all four sides of the pane to form a border in electrical contact with the coating around the periphery of the coated pane. The resultant laminate, and its production from the coated pane, will now be described with reference to the accompanying drawings in which

DESCRIPTION OF PREFERRED EMBODIMENT

Figure 1:
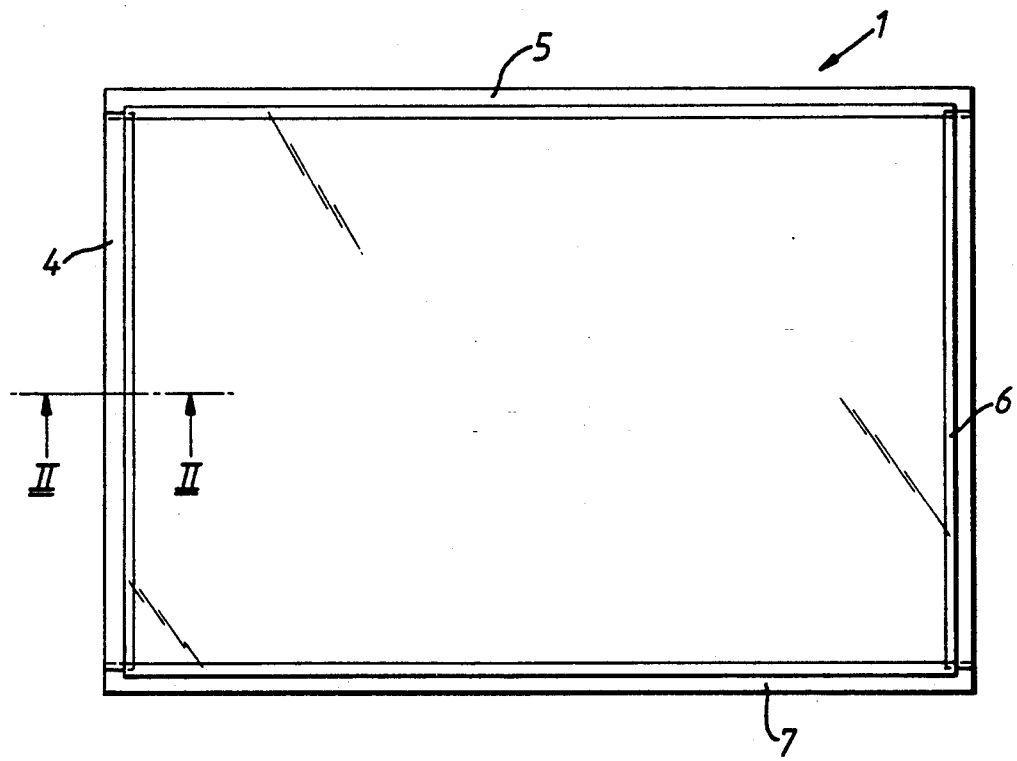
FIG. 1 is a plan view of a translucent electromagnetic shielding panel in accordance with the invention in the form of a laminate.
Figure 2:
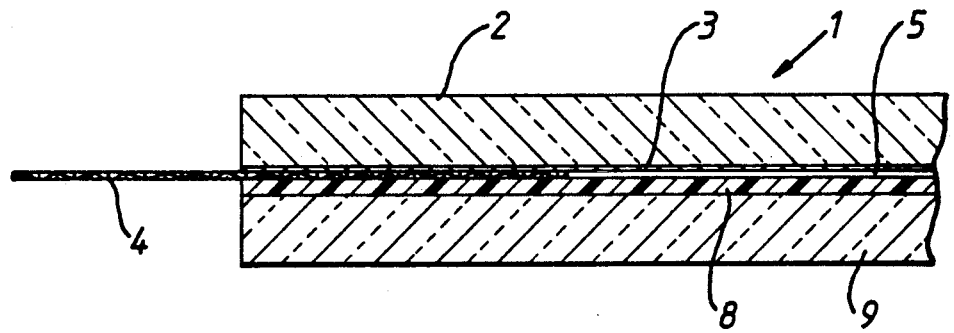
FIG. 2 is a section on an enlarged scale on the line II—II in FIG. 1.

The laminate, generally designated 1, comprises a first pane of glass 2 carrying the electroconductive coating 3. Four strips of fine electroconductive mesh, 4,5,6 and 7 lie along the edges of the laminate in electrical contact with the coating 3 and forming a border around the periphery of the laminate. The strips 4,5,6 and 7 extend beyond the edges of the pane 1 around the whole periphery of the coated pane, the overlap slightly at the corners to ensure there are no gaps between them.

The electroconductive mesh is embedded in a plastics interlayer 8 over the coated surface of the glass, and the plastics interlayer is, in turn, covered by a pane of uncoated glass 9. The electroconductive mesh extends beyond the edge of the laminate around the whole periphery of the laminate, enabling the coating to be earthed around its periphery, for example, by glazing in a window frame or support means for the glass of electroconductive metal with the electroconductive mesh in contact with the metal around the whole periphery of the laminate.

To produce the laminate, a pane of uncoated 3 mm clear float glass was cut to the same plan size as the coated pane referred to above and a rectangular sheet of 0.76 mm polyvinylbutyral, also 1500 mm×450 mm, was laid over the uncoated pane in register with the pane. Four strips of WRAPSHIELD knitted wire mesh 25 mm wide and 0.4 mm thick were cut to length and laid along the edges of the pane as indicated in FIG. 1, with a small overlap at the corners. The strips were laid so as to overlap the uncoated glass pane by 10 mm and extend 15 mm beyond the edges of the pane. (The WRAPSHIELD mesh used was a knitted mesh of tin plated, copper clad steel wire, and had a mesh size of about 1 mm. It is available in commerce from RFI Shielding Limited of Braintree, Essex, England). A soldering iron was used to weld the polyvinylbutyral to the metal mesh at intervals around the periphery of the polyvinylbutyral. The cut pane of coated 3 mm clear float glass, 1500 mm×450 mm, was then placed over the polyvinylbutyral and the mesh, in register with the polyvinylbutyral and the uncoated glass pane, and the assembly so formed 'pre-nipped' by passing it between a series of pairs of opposed press rollers with radiant heaters between adjacent pairs rollers. The assembly was heated to a temperature in the range 120° C. to 130° C. and pressed under a load of 560 kPa (80 psi). It was then heated in an autoclave at a temperature of 135° C. and a pressure of 630 kPa (90 psi) to form a laminate with good electrical contact between the metal mesh and the coating. (To check the electrical contact, a similar laminate was produced with the strips of electroconductive along two opposite edges only. The contact resistance between the strips of mesh and the electroconductive coating was found to be 1 ohm).

The resultant laminate constituted a high performance translucent electromagnetic shielding panel in accordance with the invention, with an attenuation of over 30 decibels throughout the range 20 to 10,000 MHz (when mechanically connected), and a attenuation of over 40 decibels in the range 20 to 90 MHz (when mechanically connected). The laminate, in common with the unlaminated coated glass, also has extremely beneficial optical properties as set out below:

| | |
|---|---|
| Light transmission | 42% |
| Light reflection | 42% |
| Direct solar heat transmission | 25% |
| Solar heat reflection | 51% |
| Solar heat absorption | 24% |
| Total solar heat transmission | 33% |

(measured using a CIE Illuminant C Source, with the uncoated surface of the coated pane towards the source).

It will be noted that, for both the free standing coated glass and the laminated coated glass having a silver layer of thickness 150 nm to 500 nm (preferably 225 nm to 300 nm) sandwiched between anti-reflection metal oxide layers, the light transmission is greater than the solar heat transmission. Thus the coated glasses referred to herein are useful not only in electromagnetic shielding panels, but also for high performance solar control glazings.

Figure 3:
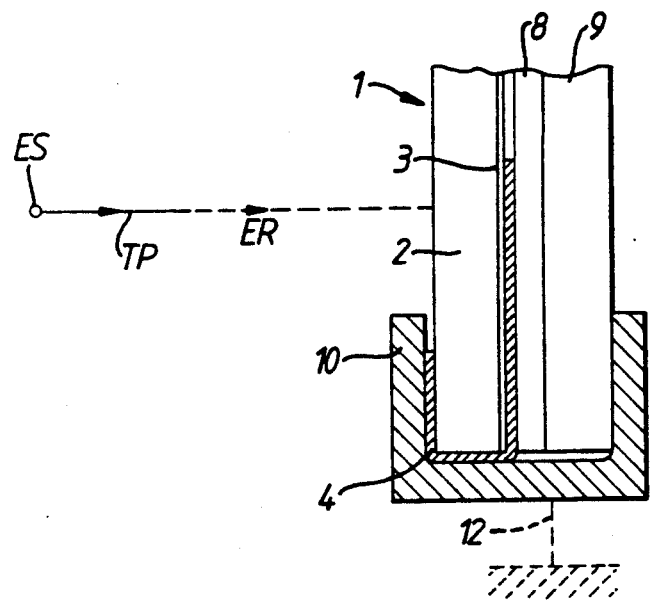
FIG. 3 shows a section of a laminate as shown in FIG. 1 mounted in a supporting frame illustrating direct mechanical contact using fine mesh.
Figure 4:
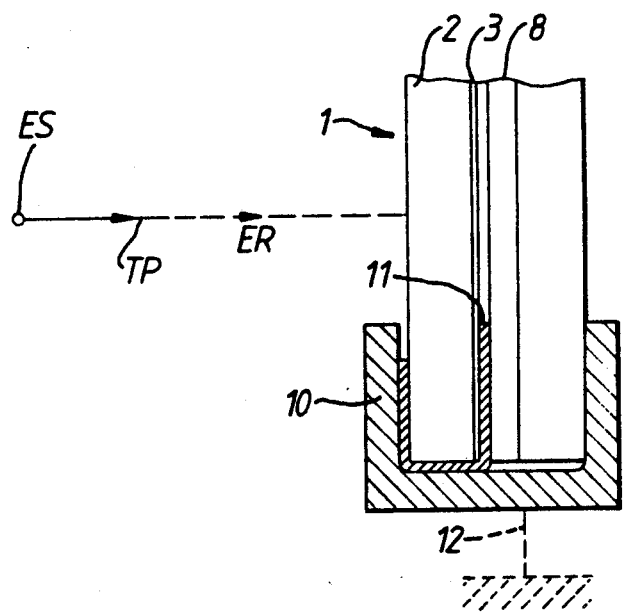
FIG. 4 shows the same section as FIG. 3 illustrating direct mechanical contact using bus bars; and, FIG. 5 shows the same section as FIG. 4 illustrating diagrammatically the capacitive coupling arrangement.

It will be seen by reference to FIG. 3 and FIG. 4, how the electrical connection means is a direct mechanical coupling in the form of a fine mesh 4 (as shown in FIG. 3) and a bus bar 11 (as shown in FIG. 4), in electrical contact with the coating 3. It will also be seen how the mesh 4 and bus bar 11 are in electrical contact with the metal frame 10. This frame may, if required, also be electrically coupled to earth as indicated by reference 12. When using a bus bar as illustrated in FIG. 4, an electrically conductive, flexible gasket (comprising typically a fine metal mesh or metal loaded rubber) may be sandwiched between the metal frame 10 and the bust bars 11 to improve the electrical contact with the frame.

Figure 5:
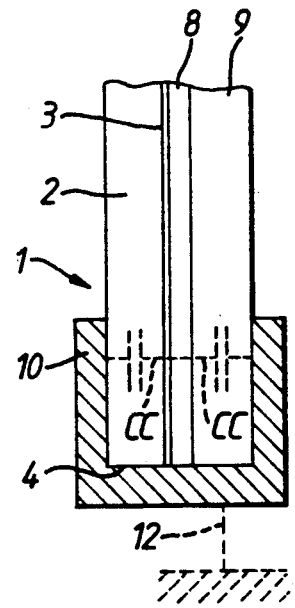

By referring to FIG. 5, is will be seen that when either the mesh 4 or the bus bars 11 are not used, the electrical connection is constituted by a capacitive coupling means CC inherently present between the coating 3 and the electroconductive surround means 10. As previously mentioned, this capacitive coupling arrangement is quite sufficient to provide sufficient electrical coupling for the electromagnetic shielding panel to provide substantial attenuation of electromagnetic radiation in the range from 200 MHz upwards to 10,000 MHz. Attenuation in these circumstances is 20 db to 25 db.

From FIG. 3 and FIG. 4, it can also be seen how electromagnetic radiation source ES follows a transmission path TP towards the electromagnetic shielding panel 1. The panel 1 attenuates the electromagnetic radiation, as has previously been discussed, in such a manner that the electromagnetic radiation on the side of the panel opposite the radiation source ES is substantially reduced.

What is claimed is:

1. A translucent electromagnetic shielding panel comprising in combination:
   a pane of glass;
   electrically conductive electromagnetic shielding means for providing a light translucent shield against electromagnetic radiation in the frequency range 20 MHz to 10,000 MHz, said electrically conductive electromagnetic shielding means consisting solely of a silver layer coating said pane of glass and having a thickness in the range of 15 nm to 50 nm;
   a protective layer disposed over the silver layer; and
   electrical connection means in direct electrical contact with the silver layer all around its periphery.

2. A panel as claimed in claim 1, wherein said silver layer has a thickness between 20 nm to 30 nm.

3. A panel as claimed in claim 1 wherein said silver layer has a thickness of at least 22.5 nm.

4. A panel as claimed in claim 1, 2 or 3 wherein the silver layer is sandwiched between anti-reflection layers of metal oxide, the outer one of which provides said protective layer.

5. A panel as claimed in claim 4 wherein the anti-reflection layers of tin oxide.

6. A panel as claimed in claim 5 wherein each tin oxide anti-reflection layer has a thickness in the range 30 nm to 50 nm.

7. A panel as claimed in claim 1 which is a laminated panel including a plastics interlayer which overlies said silver layer and said protective layer, and a further pane of glass which overlies said plastics interlayer, wherein said silver layer and the protective layer over said silver layer face inwards of the laminated panel, and said electrical connection means is sandwiched between said plastics interlayer and said protective layer and penetrates through the protective layer to make electrical contact with said silver layer around its whole periphery.

8. A panel as claimed in claim 1, which is a multiple glazing unit with said silver layer facing inwards of the unit.

9. A panel as claimed in claims 7 or 8, wherein said electrical connection means comprises bus bars in electrical contact with said silver layer around its periphery.

10. A panel as claimed in claim 9, wherein the bus bars extend around the edges of the coated glass pane from one face thereof which carries the silver layer to the face thereof opposite said one face.

11. A panel as claimed in claims 7 or 8 wherein said electrical connection means comprises a border of fine electroconductive mesh in electrical contact with said silver layer around its periphery.

12. A panel as claimed in claim 11, wherein the border of said electroconductive mesh extends beyond the edges of said pane along each side of said pane.

13. A panel as claimed in claim 1 which comprises additionally an electroconductive surround means for supporting said pane of glass, and wherein the electrical connection means provides an electrically conductive path between said silver layer and the electroconductive surround means for electromagnetic radiation captured by the panel.

14. A panel as claimed in claim 1 in an electroconductive surround means in which said electrical connection means is constituted by capacitive coupling between said silver layer and said electroconductive surround means.

15. The use of a panel as claimed in claim 14 as a light translucent shield against electromagnetic radiation having a frequency in the range 200 MHz to 10000 MHz.

16. The panel as claimed in claim 13 or 14 wherein the electroconductive surround means is coupled to earth and wherein the insertion of said panel in the transmission path of electromagnetic radiation emanating from an electromagnetic radiation source provides a substantial reduction in the electromagnetic radiation present on the side of the panel opposite the said radiation source and provides an electrically conductive path to earth for said electromagnetic radiation.

* * * * *